United States Patent [19]

Nevis et al.

[11] 3,977,955

[45] Aug. 31, 1976

[54] METHOD FOR CATHODIC SPUTTERING INCLUDING SUPPRESSING TEMPERATURE RISE

[75] Inventors: Benjamin Edward Nevis, Bethlehem, Pa.; Thomas Charles Tisone, Schaumburg, Ill.

[73] Assignee: Bell Telephone Laboratories, Incorporated, Murray Hill, N.J.

[22] Filed: May 9, 1975

[21] Appl. No.: 576,015

Related U.S. Application Data

[63] Continuation-in-part of Ser. No. 468,812, May 10, 1974, abandoned.

[52] U.S. Cl. .................................. 204/192; 204/298
[51] Int. Cl.² .......................................... C23C 15/00
[58] Field of Search ........... 204/192, 298; 118/49.1, 118/49.5

[56] References Cited

UNITED STATES PATENTS

| 3,330,752 | 7/1967 | Hallen et al. ...................... 204/192 |
| 3,502,562 | 3/1970 | Humphries .......................... 204/298 |
| 3,616,401 | 10/1971 | Cunningham et al. ............... 204/192 |
| 3,620,808 | 11/1971 | Monroe, Jr. .......................... 117/69 |
| 3,630,873 | 12/1971 | Moore et al. ....................... 204/192 |
| 3,711,327 | 1/1973 | Blumenthal et al. ................. 117/227 |
| 3,779,891 | 12/1973 | Vegh et al. .......................... 204/298 |

FOREIGN PATENTS OR APPLICATIONS

| 4,735,665 | 9/1972 | Japan ................................ 204/298 |

OTHER PUBLICATIONS

L. Maissel, Editor, "Handbook of Thin Film Technology," McGraw-Hill, N. Y. (1970), pp. 4–15, 4–16.

*Primary Examiner*—T. Tung
*Assistant Examiner*—Aaron Weisstuch
*Attorney, Agent, or Firm*—H. W. Lockhart

[57] ABSTRACT

In a vacuum system for subjecting a workpiece such as a semiconductor wafer to a beam of energy, for example as in cathodic sputtering, temperature rise of the workpiece is inhibited by mounting the workpiece in minimal thermal contact with the support structure, and orienting it so that the back surface of the workpiece, that is, the face opposite to that upon which the energy beam impinges, is directed to a black body or low temperature portion of the vacuum chamber. In combination with this technique, the back surface is suitably treated to increase its emissivity such as, for example, by applying thereto a black coating.

2 Claims, 3 Drawing Figures

U.S. Patent  Aug. 31, 1976  3,977,955
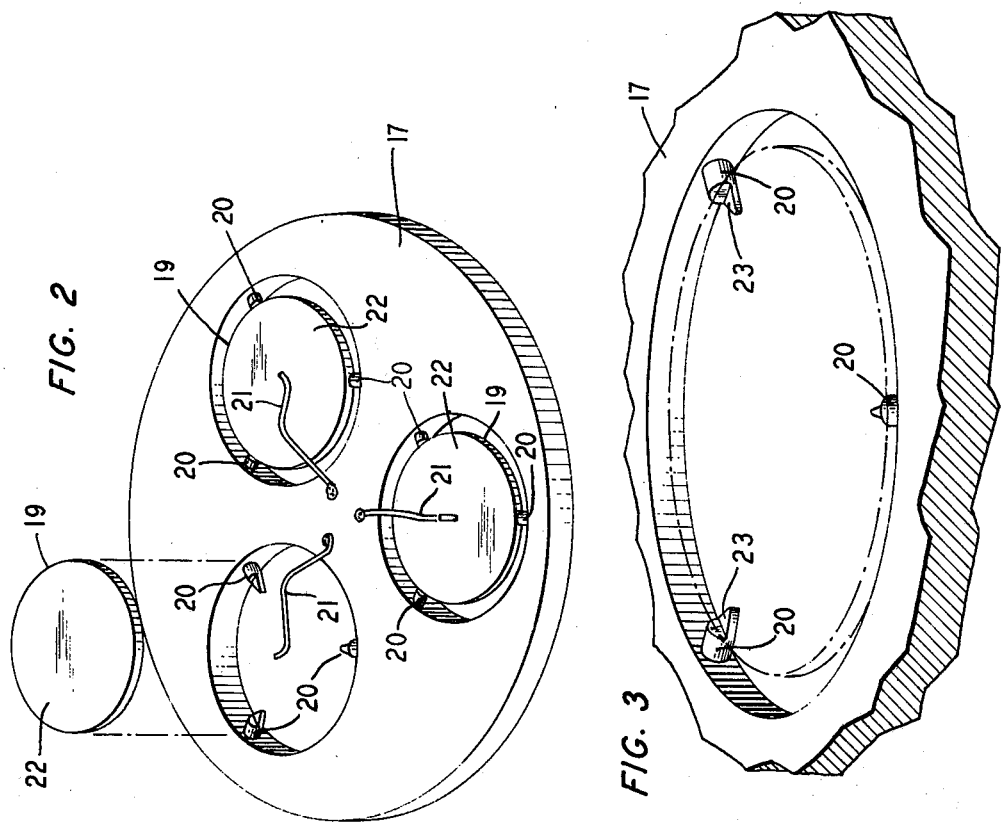
FIG. 2
FIG. 3
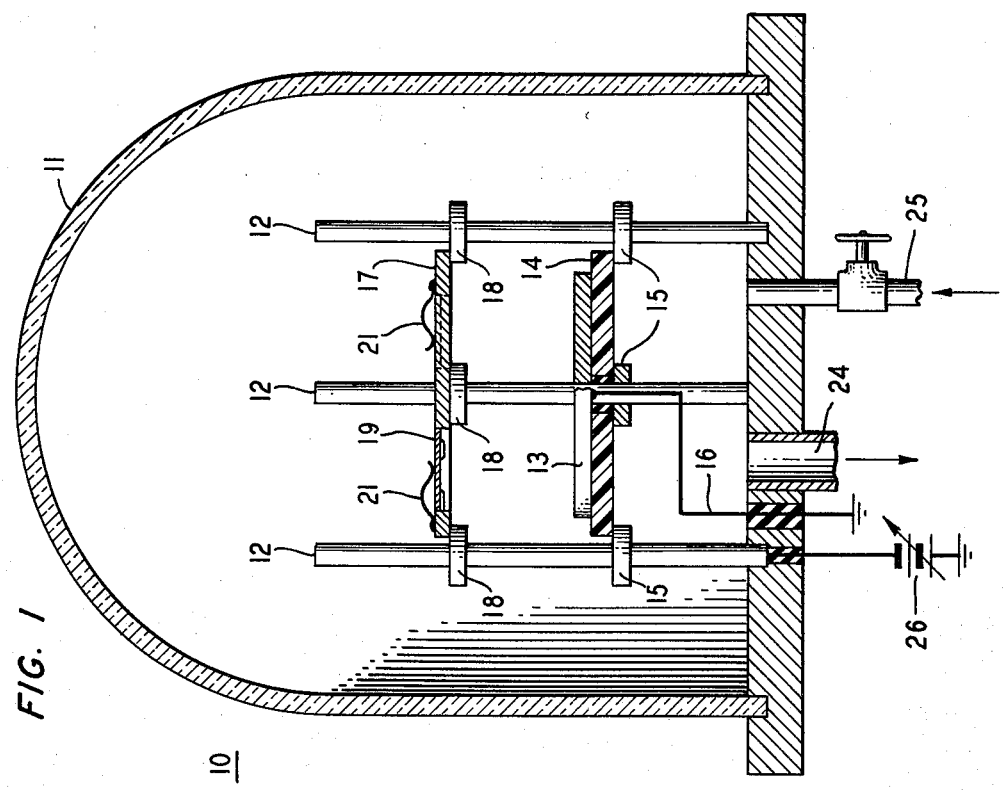
FIG. 1

METHOD FOR CATHODIC SPUTTERING INCLUDING SUPPRESSING TEMPERATURE RISE

CROSS-REFERENCE TO RELATED APPLICATION

This application is a continuation-in-part of Ser. No. 468,812 filed May 10, 1974, now abandoned.

BACKGROUND OF THE INVENTION

This invention relates to a method for inhibiting the temperature rise of a workpiece, typically a semiconductor body, when it is subjected to energy radiation in a vacuum particularly as is encountered in cathodic sputter etching.

In the fabrication of semiconductor devices, the selective removal of material from a surface by cathodic sputter etching causes the workpiece, which typically is a semiconductor wafer, to receive an energy flux in the form of electrons or ions or both. Inasmuch as a large fraction of this energy is dissipated as heat in the wafer, it is well known to take steps to inhibit the temperature rise of the wafer. Temperatures must be held at levels such that metallurgical and chemical interactions such as interdiffusion and recrystallization do not occur, inasmuch as such changes completely alter the semiconductor device structure.

Heretofore, insofar as applicants are aware, the art has resorted to cooling methods utilizing fluids, particularly water, arranged to be circulated adjacent mounting platforms for workpieces. In such arrangements, the workpiece is thermally coupled as intimately as possible to the cooling medium. A review of the patent art which discloses the use of circulating fluids for cooling indicates the cumbersomeness and complexity of such arrangements involving piping and coil arrangements as well as suitable clamping arrangements for the relatively fragile semiconductor wafer. The addition of such apparatus reduces the possibility of providing high throughput systems and obviously increases the cost.

SUMMARY OF THE INVENTION

In accordance with this invention, the temperature rise of a semiconductor wafer subjected to energy flux in a vacuum ambient is inhibited by the technique of mounting the wafer in minimal contact with it supporting structure and by orienting it so that the back surface thereof faces into the black body portion of the vacuum chamber. In this sense the black body portion is a cooler, if not the coolest, part of the vacuum chamber. In addition, the back surface may be treated so as to increase its emissivity to the greatest degree practicable. Typically, this may be done by applying a coating of black material to provide a nonreflective, radiative black matte surface.

It has been found that by the foregoing technique there is realized a passive control of the peak wafer temperature by thus increasing the radiative interchange between the wafer and its surroundings. This has been found to be effective in controlling the wafer temperature to levels below those at which undesirable reactions occur and without resorting to the complexities of water or other circulating fluid cooling methods.

Thus, a particular object of the invention is passively to reduce the steady state temperature of a workpiece, such as a semiconductor wafer, in a vacuum ambient wherein the wafer is exposed to a substantially constant power density from a beam of energy as encountered in cathodic sputter etching.

BRIEF DESCRIPTION OF THE DRAWING

The invention and its further objects and features will be more clearly understood from the following detailed description taken in conjunction with the drawing in which FIG. 1 is a schematic view in section depicting a greatly simplified cathodic sputter etching apparatus utilizing the cooling method in accordance with this invention;

FIG. 2 is a perspective view of a holder for mounting semiconductor wafers in accordance with the method of this invention; and FIG. 3 is an enlarged cutaway view of a portion of the holder showing the arrangement for a single semiconductor wafer.

DETAILED DESCRIPTION

The arrangement shown in FIG. 1 is a greatly simplified structure for carrying out cathodic sputter etching of a semiconductor wafer, typically of silicon. The apparatus 10 of FIG. 1 includes the conventional vacuum chamber composed of a bell jar 11 having an exhaust tube 24 for evacuating the chamber and a gas inlet line 25. For simplicity, the anode and cathode members are shown supported in three vertical support members 12. The anode member 13 is a metal plate mounted on an insulating member 14 retained on stops 15 affixed to the vertical supports 12. The anode member 13 is electrically connected to ground by way of insulated lead 16.

In accordance with the method of this invention, silicon semiconductor wafers are mounted in a holder 17 above the anode with the active face of the wafers directed downward toward the anode. Accordingly, the sputter etching occurs on this underface. Electrical connection is made to the holder 17 and thence to the semiconductor wafers 19 from a variable source of potential 26 by way of the vertical support structure 12 and adjustable stops 18. The semiconductor wafers 19 are in minimal contact with the metal holder 17, being supported on the tip portion of mounting lugs 20 projecting from the sidewalls of suitably sized openings in the holder. Each wafer is held in place by a retention spring 20.

During sputter etching an ion stream is generated and the difference in potential causes the impingement of particles against the underface of each wafer, resulting in the removal of material from the face of the wafer in accordance with techniques well known in the art. It is known that the sputter etch rate varies depending upon the particular material being exposed and semiconductor fabrication processing may involve the selective or complete removal of particular layers of metals, semiconductors, dielectrics, organics, as well as other materials. During this sputtering process, the wafer is subjected to an energy flux which causes heating of the wafer, which heat must be dissipated in order to prevent an undue temperature rise of the wafer with deleterious effects already referred to. In particular, undue heating may cause unwanted metallurgical and chemical reactions of the various metals present such as alloying or interdiffusion, or conversion which may in effect, totally destroy the device structures which have already been produced within the semiconductor wafer.

In particular, it will be appreciated that, at this point in the fabrication process, the semiconductor wafers comprise an array of hundreds, or even thousands of individual semiconductor devices. These devices have been formed by the controlled selective introduction of significant impurities into the wafer and by the application, likewise, in controlled fashion, of metal and other films to the surfaces of the wafer. The sputter-etching process then is used to selectively define such films which, for example, may form the metal interconnection pattern and external connections, such as beam leads, of the semiconductor devices.

It is critically important that particular temperature levels not be exceeded at this phase of the fabrication lest there occur metallurgical reactions such as alloying, diffusion or intermetallic reactions which would, as a practical matter destroy the devices. For example, for silicon semiconductor devices using metalization patterns comprising titanium, platinum or palladium, and gold in multiple layer arrangements temperatures much in excess of 275°C are likely to produce irreparable damage to the device structures. Thus, it is important that the wafer emit sufficient heat to avoid rising above that temperature. For the above-recited materials temperatures of 275°C or higher will generally so deleteriously affect the device structures as to render them unusable.

Referring to FIG. 2, the holder 17 is shown in an enlarged view to enable greater detail in the illustration. In particular, three silicon semiconductor wafers 19 are shown mounted in the circular openings in the holder 17. One wafer 19 is shown detached from the holder 17 but in alignment with the mounting lugs 20 projecting from the sidewalls of the circular openings. The wafers 19 which are shown in place in the holder are held by the retention springs 21 applied to the back surfaces 22 and anchored to the adjoining surface of the holder 17. As already noted, in an additional, optional procedure, the back surface 22 of each wafer is coated with a material to increase its emissivity. Various materials are well known for such purposes. For example, lamp black may be used, or a particularly convenient material is a product of Minneapolis Mining and Manufacturing Corporation, Decorative Products Division, 3M Center, St. Paul, Minn. 55101, identified as "Nextel Brand, Velvet Coating (101-C10 Black)."

FIG. 3 indicates in somewhat greater detail the conformation of the mounting lugs 20 showing the tips thereof with the minimal area mounting surface 23 on each tip. Thus, it is apparent that thermal coupling between the wafer 19 and the holder 17 is exceedingly small.

Minimal contact support in terms of this disclosure is that in which the support members are in contact with about from one-tenth to three percent of the area of the one major face of semiconductor wafer. The lower limit is subject to the practical limitations of providing stable and secure mounting and sure and adequate electrical connection. The upper limit is governed by the desirability, in accordance with the principles of this invention, of minimizing thermally conductive paths to the wafer holder.

For example, a semiconductor wafer having a diameter of two inches supported in a holder which contacts a 15 mil wide peripheral edge of the wafer falls within the above limitation. Inasmuch as the length of the mounting lugs 20 typically need not exceed 15 mils their use reduces the contact area well below the upper limit of about 3 percent of the area of the face of the wafer.

It will be understood that this limitation of minimal contact support is most significant for materials having relatively good thermal conductivity, comparable to silicon, germanium, and compound semiconductors of the III-V grouping. Minimal thermal contact is of less importance if the wafer is of a material such as garnet, for example, which has a thermal conductance about one-twentieth that of silicon.

It will be apparent that holders may be devised having different configurations but also utilizing the method of this invention of providing a minimal thermal contact with the orientation of the back surface or heat emitting surface towards the black body portion of the chamber. In this embodiment the black body portion is the upper or "dead space" in the vacuum chamber which represents the lower level of the thermal gradient within the chamber and hence, the portion into which heat is most readily dissipated. It is apparent that the holder may be enlarged to accommodate a greater number of wafers in a similar design.

In a specific embodiment, the holder 17 is machined from aluminum and may be sized so as to accommodate two-inch diameter silicon wafers. In a test of this technique, silicon semiconductor wafers were coated with 5000 angstroms of thermally grown silicon dioxide on both faces thereof. The silicon dioxide was removed from one side of the wafer and the other side was metallized wih a layer of tungsten about 10,000 angstroms thick. On the bare silicon side a small contact area comprising a tungsten pad with a ground strip was deposited. The wafer temperature was measured by mechanically contacting both leads of a thermocouple to the tungsten pad with the thermocouple being shielded to enable EMF measurements to be made in the presence of an energy beam. Using a wafer with the back surface coated with 5000 angstroms of silicon dioxide so as to exhibit an emissivity of 0.42, subjecting the wafer to a power density of 0.2 watts per square centimeter, of which approximately half heats the wafer, resulted in a steady state temperature of 166°C. Increasing the power density to 0.4 watts per square centimeter produced a steady state temperature of 263°C. When the back surface of the wafer was coated with the 3-M Black Velvet paint to provide an emissivity of 1.0, the application of a power density of 0.4 watts per square centimeter produced a steady state temperature of 180°C. These temperature results are comparable with those achieved using complex water cooling arrangements and the advantages of the simplified method in accordance with this invention are apparent. The above-noted temperatures are eminently satisfactory for most silicon semiconductor device processing.

The temperature limits set forth herein relate particularly to the most common semiconductor materials, most particularly silicon and particularly to metallization systems including gold. For such systems the practical upper working limit is about 275°C.

Under certain conditions, depending upon factors such as the structural relation of the different materials this limit may extend to 300°C. It will be recognized that the procedure in accordance with this invention is significant only with respect to materials which, when subjected to sputter etching, may be heated to a temperature at which deleterious changes occur.

Although this specific description is in terms of silicon semiconductor material, the method is applicable to a wide variety of materials, semiconductors such as germanium and the III–V and II–VI compounds as well as other crystalline, ceramic and other materials which may be subjected to undue heating during cathodic sputter etching.

What is claimed is:

1. In the fabrication of semiconductor devices, the method of inhibiting the temperature rise of a semiconductor wafer comprised of an array of semiconductor devices during sputter etching of said wafer in an evacuated chamber, said semiconductor wafer having a pair of opposed major surfaces, the one of said surfaces to be etched having thereon films of inorganic dielectric material and at least one metal film, said films being susceptible to alteration at temperatures in excess of about 275°C, said chamber including, in a first portion, support means for said wafer and sputter etching means, the portions of said chamber remote from said first portion being at a lower temperature during sputter etching than said first portion, said method comprising the step of:

mounting said wafer in said support means which contact from about one-tenth to about three percent of the area of one major face of said wafer, said major surface opposite the surface to be etched being free of any proximate conductive covering whereby heat is emitted from said wafer substantially entirely by radiation.

2. The method in accordance with claim 1 including the additional step of orienting said wafer so that the major face opposite to the face which is being sputter etched is directed toward the remote portions of said chamber.

* * * * *